(12) United States Patent
Griggs et al.

(10) Patent No.: US 10,571,312 B2
(45) Date of Patent: Feb. 25, 2020

(54) ADJUSTABLE MOUNTING SYSTEM

(71) Applicant: Databuoy Corporation, Vienna, VA (US)

(72) Inventors: Stephen Patrick Griggs, Vienna, VA (US); Hamilton Michael Glasser, LaVale, MD (US); Kathleen Ann Griggs, Vienna, VA (US)

(73) Assignee: Databuoy Corporation, Vienna, VA (US)

( * ) Notice: Subject to any disclaimer, the term of this patent is extended or adjusted under 35 U.S.C. 154(b) by 0 days.

(21) Appl. No.: 16/112,956

(22) Filed: Aug. 27, 2018

(65) Prior Publication Data

US 2019/0041245 A1 Feb. 7, 2019

Related U.S. Application Data

(60) Provisional application No. 62/526,385, filed on Jun. 29, 2017.

(51) Int. Cl.
G01D 11/24 (2006.01)
H05K 5/02 (2006.01)

(52) U.S. Cl.
CPC .......... G01D 11/245 (2013.01); H05K 5/0204 (2013.01); H05K 5/0247 (2013.01)

(58) Field of Classification Search
CPC .... G01D 11/24; G01D 11/245; H05K 5/0204; H05K 5/0247
See application file for complete search history.

(56) References Cited

U.S. PATENT DOCUMENTS

| 3,681,732 A | 8/1972 | Toeppen |
| 3,906,534 A | 9/1975 | Shirasaki |
| 4,017,878 A | 4/1977 | Hagiwara |
| 4,243,981 A | 1/1981 | Beyersdorf |
| 4,302,077 A | 11/1981 | Sata et al. |
| 4,307,954 A | 12/1981 | Ludwig |
| 4,659,203 A | 4/1987 | Niwa et al. |
| 5,368,427 A | 11/1994 | Pfaffinger |
| 5,403,198 A | 4/1995 | Koganemaru et al. |

(Continued)

FOREIGN PATENT DOCUMENTS

| WO | 2007039334 A1 | 4/2007 |
| WO | 2012176028 A1 | 12/2012 |

(Continued)

Primary Examiner — Jamel E Williams

(57) ABSTRACT

A first plate comprises a first lip, lip gaps, and first indexing formations. The first lip extends around a portion of the first plate. The lip gaps are distributed along the first lip. The first indexing formations are distributed along the first lip between lip gaps. A second plate comprises mounting points, a second lip, mounting tabs, and second indexing formations. The mounting points may receive mounting fasteners to secure the second plate to an object. The second lip extends around a portion of the second plate. The mounting tabs are distributed along the second lip and positioned to align with lip gaps. The second indexing formations are disposed on mounting tabs to engage first indexing formations in response to the second plate having mounting tabs inserted through lip gaps and rotated until at least one first indexing formation is aligned with at least one second indexing tab.

20 Claims, 11 Drawing Sheets

(56) References Cited

U.S. PATENT DOCUMENTS

| | | |
|---|---|---|
| 5,659,293 A | 8/1997 | Shibata et al. |
| D405,216 S | 2/1999 | Porter et al. |
| 5,909,955 A | 6/1999 | Roorda |
| 6,160,487 A | 12/2000 | DeLuca |
| 6,292,142 B1 | 9/2001 | Pittman |
| 6,352,384 B1 | 3/2002 | Frisch et al. |
| 6,433,700 B1 | 8/2002 | Malewski |
| 6,666,701 B1 | 12/2003 | Burkhardt et al. |
| 7,123,158 B2 | 10/2006 | Deluca et al. |
| 7,334,960 B2 | 2/2008 | Glessner et al. |
| 7,336,165 B2 | 2/2008 | Fuchs |
| 7,463,159 B2 | 12/2008 | Hess et al. |
| 7,965,175 B2 | 6/2011 | Yamano |
| 8,125,320 B2 | 2/2012 | Yamano |
| 8,573,868 B2 | 11/2013 | Hasuda et al. |
| 8,687,299 B1 | 4/2014 | Sanford et al. |
| 8,911,252 B2 | 12/2014 | Sittenauer |
| 8,970,387 B2 | 3/2015 | Brigham et al. |
| 9,057,631 B2 | 6/2015 | Newton |
| 9,091,388 B2 * | 7/2015 | Zribi ............... F16M 13/02 |
| 2004/0203493 A1 | 10/2004 | Carlson |
| 2010/0117840 A1 | 5/2010 | Rutter et al. |
| 2015/0030375 A1 * | 1/2015 | Kawaguchi ......... G01D 11/30 403/19 |
| 2016/0049054 A1 | 2/2016 | Simmons |
| 2016/0189512 A1 | 6/2016 | Leatherby |
| 2016/0345447 A1 | 11/2016 | Kraz |

FOREIGN PATENT DOCUMENTS

| | | |
|---|---|---|
| WO | 2015197848 A1 | 12/2015 |
| WO | 2016053476 A1 | 4/2016 |

\* cited by examiner

ADJUSTABLE MOUNTING SYSTEM

CROSS-REFERENCE TO RELATED APPLICATIONS

This application claims the benefit of U.S. Provisional Application No. 62/526,385, filed Jun. 29, 2017, which is hereby incorporated by reference in its entirety.

BRIEF DESCRIPTION OF THE SEVERAL VIEWS OF THE DRAWINGS

A further understanding of the nature and characteristics of various embodiments may be realized by reference to the following figures. In the appended figures, similar components or features may have the same reference label. Further, various components of the same type may be distinguished by following the reference label by a second reference label (usually a letter that distinguishes among the similar components. If only the first reference label is used in the specification, the description is applicable to any one of the similar components having the same first reference label irrespective of the second reference label. Throughout this description, examples shown are illustrated to describe various example embodiments, rather than as limitations on the present invention.

DETAILED DESCRIPTION OF THE EMBODIMENTS

Figure 1A:
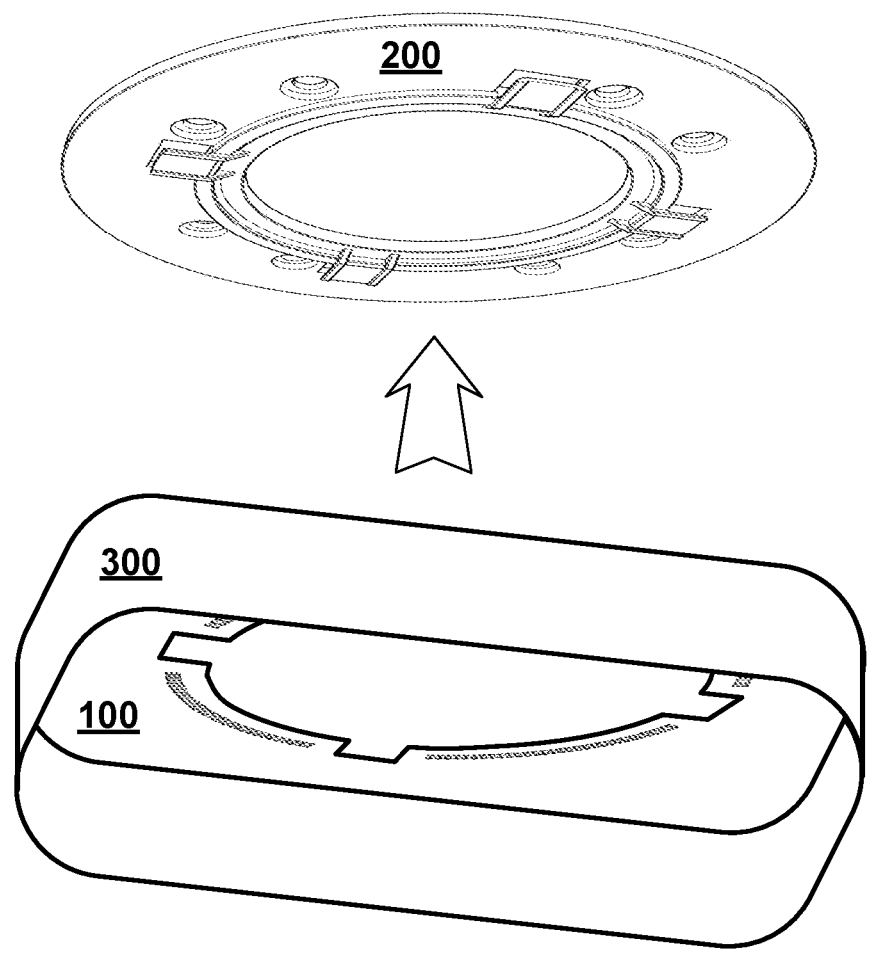
FIG. 1A and FIG. 1B are diagrams of an adjustable sensor mounting system according to an aspect of an embodiment of the disclosure.

An adjustable mount is disclosed that allows a housing to be rotated while remaining fully engaged with a mounting plate, thus allowing an installer (a user installing or otherwise positioning the housing) to select a desired rotational position of the housing in relation to the mounting plate. By allowing the housing to be rotated while being fully engaged with the mounting plate, the user may rotate the housing to a desired position and leave the housing in such an orientation. For instance, if a housing comprising directionally sensitive sensors is being mounted to a ceiling, a wall, a lighting fixture, and/or the like, it may be desired for the alignment of the housing to rotationally adjusted so that the directionality of the sensors within are positioned to perform. Such a design may allow a mounting plate to be attached to a surface by fasteners with little regard for orientation of the mounting plate. A fastener may comprise a hardware device that mechanically joins or affixes two or more objects together. According to an embodiment, fastener(s) may be used to create non-permanent joint(s); that is, joint(s) that may be removed or dismantled without damaging the joining components. Examples of non-permanent fastener(s) comprise, but are not limited to: screws, nails, buttons, clips, magnets, suction cups, staples, bolts, straps, and/or the like. According to an embodiment, fastener(s) may create a permanent joint; that is, joint(s) that may be joined such that there is a likelihood of damage when removing or dismantling the joining components. Examples of permanent fastener(s) comprise but are not limited to: crimping sleeves and/or tabs, welding materials, solder, tape, glue, cement, other adhesives, and/or the like. Once the housing is coupled with the surface mount plate, the housing may be rotated to the desired rotational orientation. Such arrangements can help eliminate the need for adjusting the orientation of the surface mount plate.

According to an embodiment, a mounting plate may comprise multiple mounting holes, which may be designed to receive fasteners. The mounting plate may be, for example, a surface mounting plate. A mounting plate may be first structure that mounts hardware to a second structure such as, for example, a wall, a ceiling, a cabinet, a floor, a pole, a mobile device, and/or the like. The mounting plate may comprise a shape that is complementary to the second structure. Such holes may allow for fastener(s) to be used to mount the mounting plate to a second structure, such as a surface. An orientation of the mounting plate with relation to the surface may not be critical since the housing to be attached with the surface mount plate may be rotated after being coupled with the mounting plate.

The housing may comprise sensors. Sensors may comprise, for example: sound sensors, imaging sensors, video and/or still cameras, temperature sensors, smoke sensors, carbon monoxide sensors, humidity sensors, combinations thereof, and/or the like. It may be useful to arrange the orientation of some of the sensors. For example, sound sensor(s) in the housing may be oriented to be employed to determine the source of an audio generating event. Similarly, for example, sound sensor(s) in the housing may be oriented in relation to sensors in other housings to be employed together to determine the source of an audio generating event.

According to an embodiment, the housing may comprise a rectangular shape. According to an embodiment, the housing may have a curved shape. The housing may comprise a shape adapted to the at least one sensor. According to an embodiment, the housing may comprise a material(s) such as, metal, plastic, composites, wood, and/or the like.

The mounting plate may allow the housing to attach to, for example, a standard electrical box. Once attached, the housing may be rotated. The rotation may allow the housing to be orientated such that, for example, sensor(s) in the housing get pointed in a desired direction. A rotation wheel may be constructed between the housing and mounting plate that comprises, for example, indexing formations (i.e. cogs) that catch and lock the housing in place once the correct orientation has been reached.

According to an embodiment, the mounting plate may comprise a rectangular shape. According to an embodiment, the mounting plate may comprise a curved shape. The mounting plate may comprise a shape adapted to the housing. According to an embodiment, the mounting plate may comprise a material(s) such as, metal, plastic, composites, wood, and/or the like.

Figure 1B:
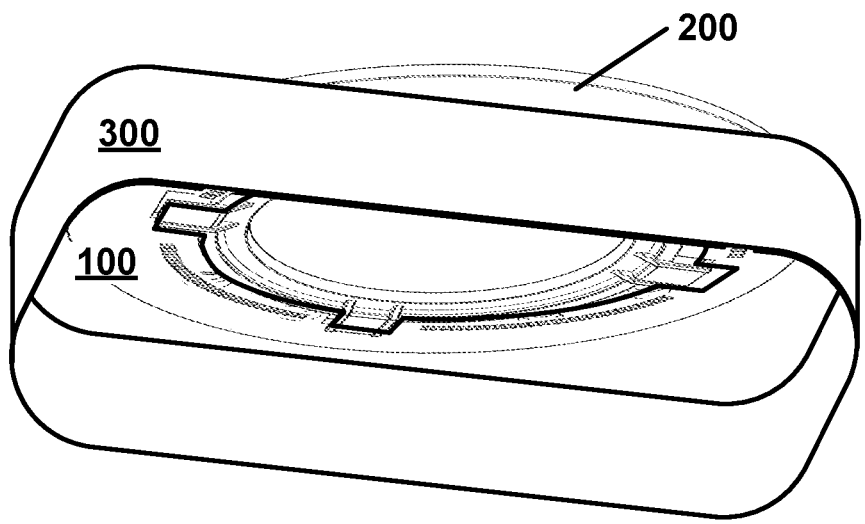

FIG. 1 is a diagram of an example adjustable mounting system with a housing 300 engaging mounting plate 200 according to an aspect of an embodiment of the disclosure. The adjustable mounting system may comprise a sensor housing 300, a first plate 100 of the sensor housing 300, and a second plate 200. The second plate 200 may be a mounting plate. The adjustable mounting system may further comprise at least one sensor. The at least one sensor may comprise a directional preference and be disposed in the sensor housing 300.

The at least one sensor may comprise "directional" sensing devices (such as, for example, a directional microphone, an array of microphones, a camera with a directional field of view, an antenna with a directional region) which senses a physical phenomenon in a certain direction depending on the chosen orientation. In other words, the at least one sensor may comprise a unique directional sensing region. According to an embodiment, the at least one sensor may comprise directional sensor(s) with multiple sensing regions, and the orientation of the at least one sensor may determine the actual sensing region based on the multiple sensing regions. Thus, the coverage of the at least one sensor may comprise a directional sensing preference based on the multiple sensing regions of the at least one sensor.

The first plate 100 of the sensor housing 300 may comprise: a first circular lip, a plurality of distributed lip gaps, a plurality of first indexing formations, and a first wiring via. The first circular lip may extend around at least a part of a first portion of the first plate 100. The plurality of distributed lip gaps may be distributed along the first circular lip. The plurality of first indexing formations may be distributed along the first circular lip between at least two of the plurality of distributed lip gaps. According to an embodiment, the first wiring via may be positioned on the concave side of the first circular lip. According to an embodiment, the first wiring via may be positioned in a center portion of the first plate 100.

The second plate 200 may comprise: a plurality of attachment mounting points, a second circular lip, a second wiring via, a plurality of distributed indexing tabs, and a plurality of second indexing formations. The plurality of attachment mounting points may be mechanically configured to receive a plurality of mounting fasteners. The mounting fasteners may be mechanically configured to secure the second plate 200 to, for example, an electrical box, a surface, a structure, and/or the like. The second circular lip may extend around at least a part of a second portion of the second plate 200. The second wiring via may be positioned on the concave side of the second circular lip. The plurality of distributed indexing tabs may be positioned and mechanically configured along the second circular lip in relative alignment to at least two of the plurality of distributed lip gaps.

The plurality of second indexing formations may be disposed on the plurality of distributed mounting tabs. The plurality of second indexing formations may be mechanically configured to engage at least one of the plurality of first indexing formations in response to the second plate 200: having at least two of the plurality of distributed mounting tabs inserted through at least two of the plurality of distributed lip gaps, and rotated with respect to the first plate 100 until at least one of the plurality of first indexing formations is aligned with at least one of the plurality of second indexing formations, and there is sufficient force applied between at least one of the plurality of first indexing formations and at least one of the plurality of second indexing formations to hold the first plate 100 in relative position with the second plate 200.

An example embodiment of a mounting system is further described with the assistance of example figures. The mounting system may comprise: a first plate 100 (illustrated in FIG. 2) and a second plate 200 (illustrated in FIG. 3).

Figure 2:
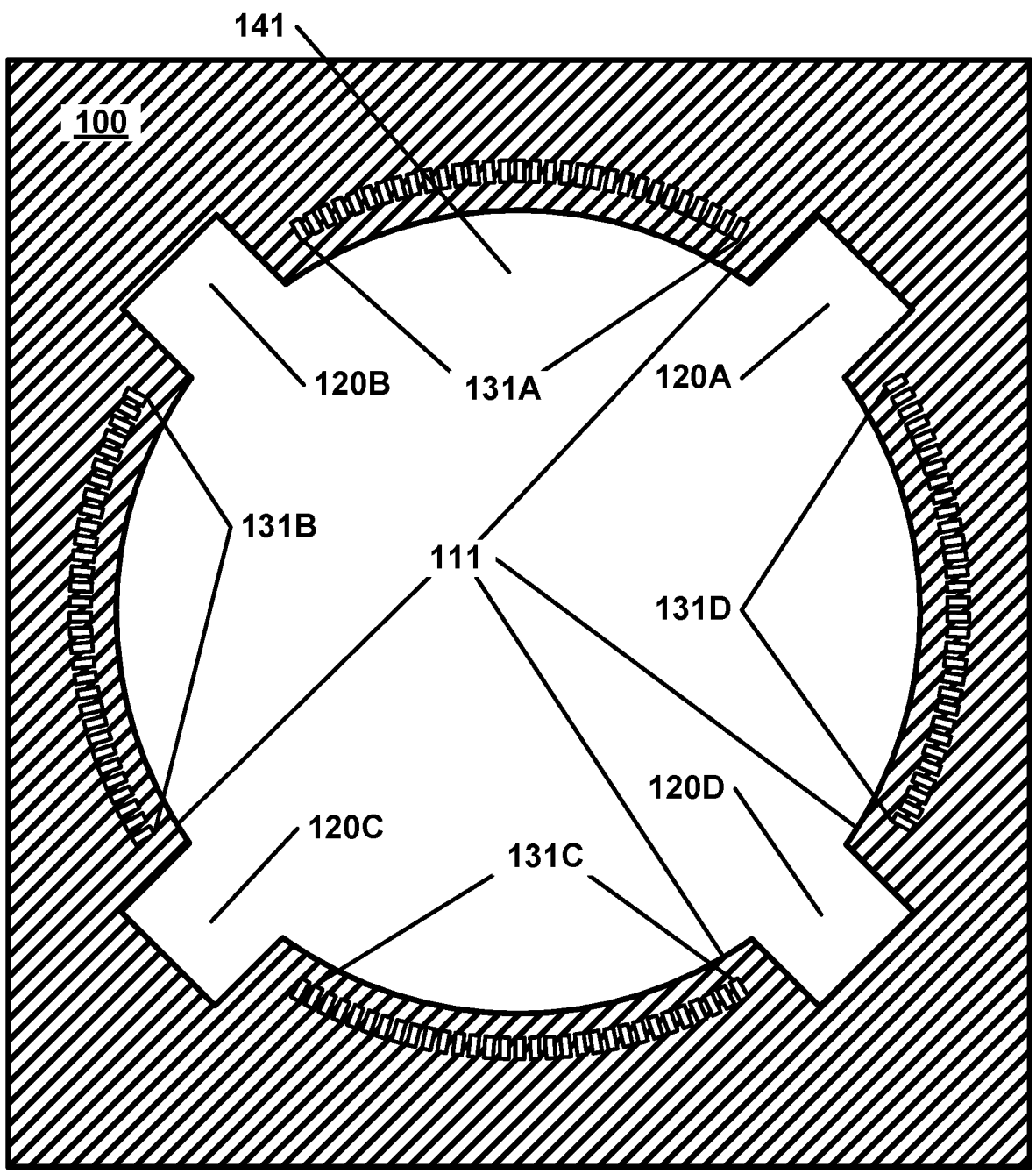
FIG. 2 is a perspective view of a plate according to an aspect of an embodiment of the disclosure.

FIG. 2 is a top view of a first plate 100 according to an aspect of an embodiment of the disclosure. The first plate 100 may be a housing plate. A first lip 111 may extend around at least a part of a first portion of the first plate 100. A plurality of lip gaps (for example, 120A, 120B, 120C, and 120D) may be distributed along the first lip 111. A plurality of first indexing formations (for example, 131A, 131B, 131C, and 131D) may be distributed along the first lip 111 between at least two of the plurality of distributed lip gaps (for example, 120A, 120B, 120C, and 120D).

According to an embodiment, the first plate 100 may be disposed to a sensor housing (for example, sensor housing 300). According to an embodiment, the first plate 100 may be integrated with a (for example, sensor housing 300). According to an embodiment, the first plate 100 may be mechanically configured to mount to a sensor housing (for example, sensor housing 300). According to an embodiment, the first plate 100 may comprise first plate mounting points. The first plate mounting points may comprise locations and/or structures adapted to mount the first plate 100 to sensor housing 300.

According to an embodiment, the first lip 111 may be substantially circular. Substantially circular means the first lip may be shaped for rotation when engaged with another lip, (for example, lip 210). There may be variations in the shape of circular lip 111, as long as the first plate 100 is rotatable with respect to mounting plate 200 when the first plate 100 is engaged as described herein with mounting plate 200. According to an embodiment, the first lip 111 may run along a perimeter of the first plate 100. According to an embodiment, the first lip 111 may run along an outer perimeter of the first plate 100. According to an embodiment, the first lip 111 may run along an inner perimeter of the first plate 100. According to an embodiment, the first lip 111 may run a distance from a point located in a center portion of the first plate 100. According to an embodiment, the first lip 111 may rise from the plane of the first plate 100. According to an embodiment, at least a portion of the first lip 111 may be sized to rotatably surround at least another portion of the first lip 111.

According to an embodiment, the first portion may comprise an outer section of the first plate 100. According to an embodiment, the first portion may comprise an inner section of the first plate 100. According to an embodiment, the first portion may comprise a void 141 in the first plate 100. According to an embodiment, the void 141 may be a wiring via. According to an embodiment, the first portion may comprise an elevated portion of the first plate 100. According to an embodiment, the first portion may comprise a sunken portion of the first plate 100.

According to an embodiment, at least two of the plurality of lip gaps (for example, 120A, 120B, 120C, and 120D) may comprise a void larger than at least two of the plurality of mounting tabs (for example, 250A, 250B, 250C, and 250D). According to an embodiment, at least two of the plurality of lip gaps (for example, 120A, 120B, 120C, and 120D) may be in relative alignment with at least two of the plurality of mounting tabs (for example, 250A, 250B, 250C, and 250D). According to an embodiment, at least one of the plurality of lip gaps (for example, 120A, 120B, 120C, and 120D) may comprise a formed portion of a second lip 212.

According to an embodiment, at least one of the plurality of first indexing formations (for example, 131A, 131B, 131C, and 131D) may comprise a gap. According to an embodiment, at least one of the plurality of first indexing formations (for example, 131A, 131B, 131C, and 131D) may comprise a bulge. According to an embodiment, at least one of the plurality of first indexing formations (for example, 131A, 131B, 131C, and 131D) may be complementary shaped to at least one of the plurality of second indexing formations (for example, 267A, 267B, 267C, and 267D). According to an embodiment, at least one of the plurality of first indexing formations (for example, 131A, 131B, 131C, and 131D) may be engage at least one of the plurality of second indexing formations (for example, 267A, 267B, 267C, and 267D). According to an embodiment, at least one of the plurality of first indexing formations (for example, 131A, 131B, 131C, and 131D) may comprise a restorative spring force sufficient to prevent the first plate 100 from rotating relative to the second plate 200.

Figure 3:
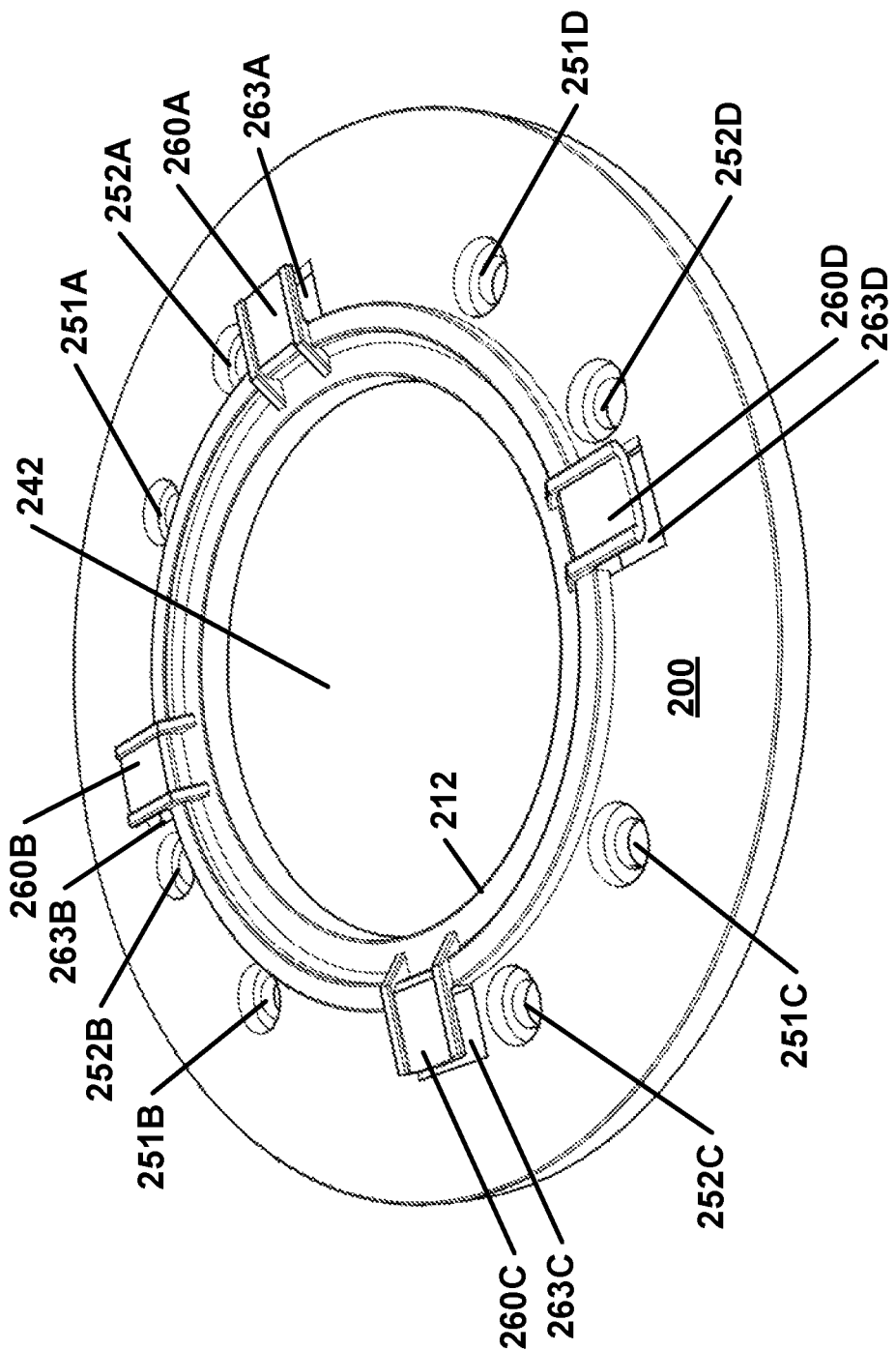
FIG. 3 is a top view of a mounting plate according to an aspect of an embodiment of the disclosure.
Figure 4:
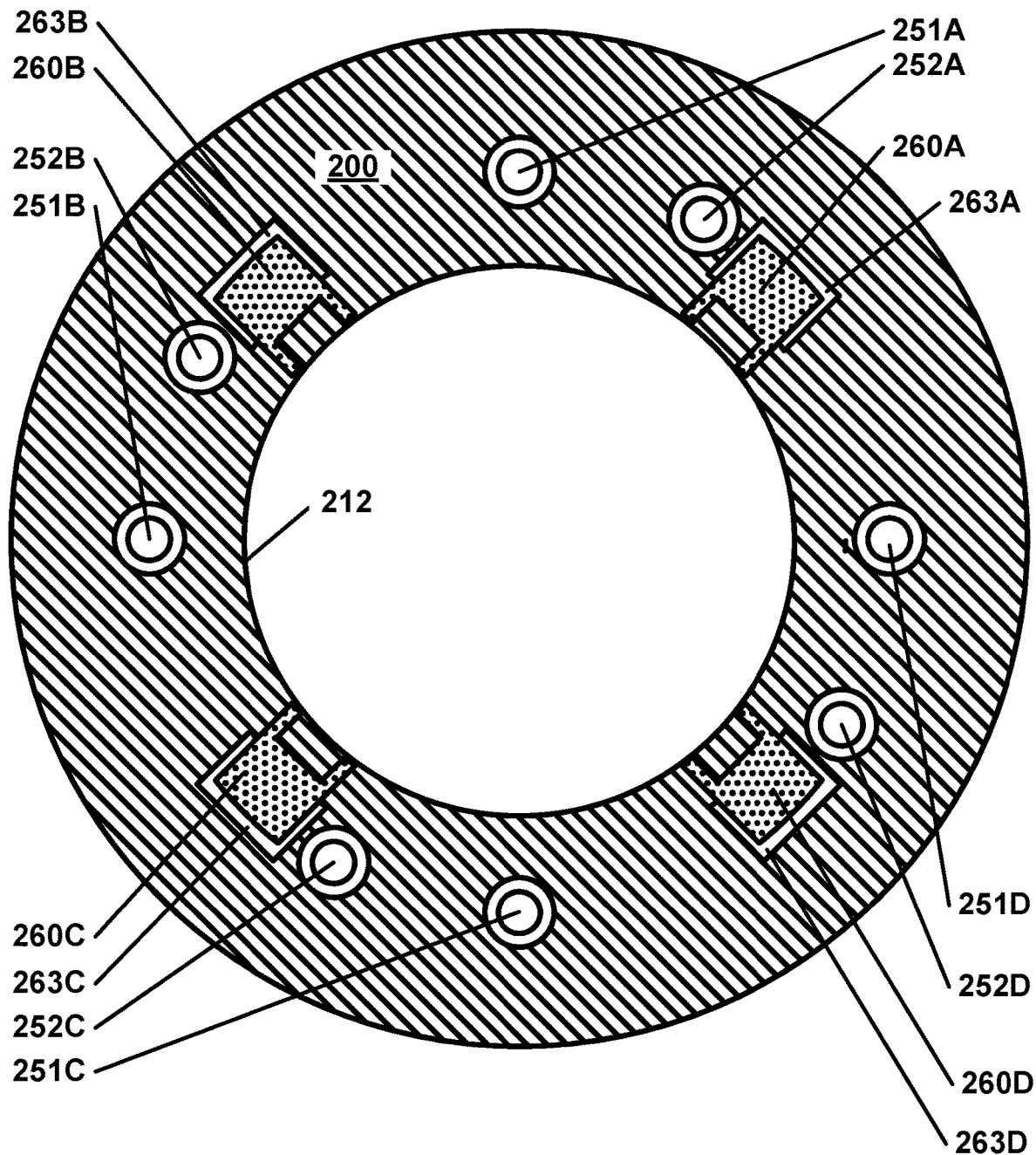
FIG. 4 is a top view of a mounting plate according to an aspect of an embodiment of the disclosure.
Figure 5:
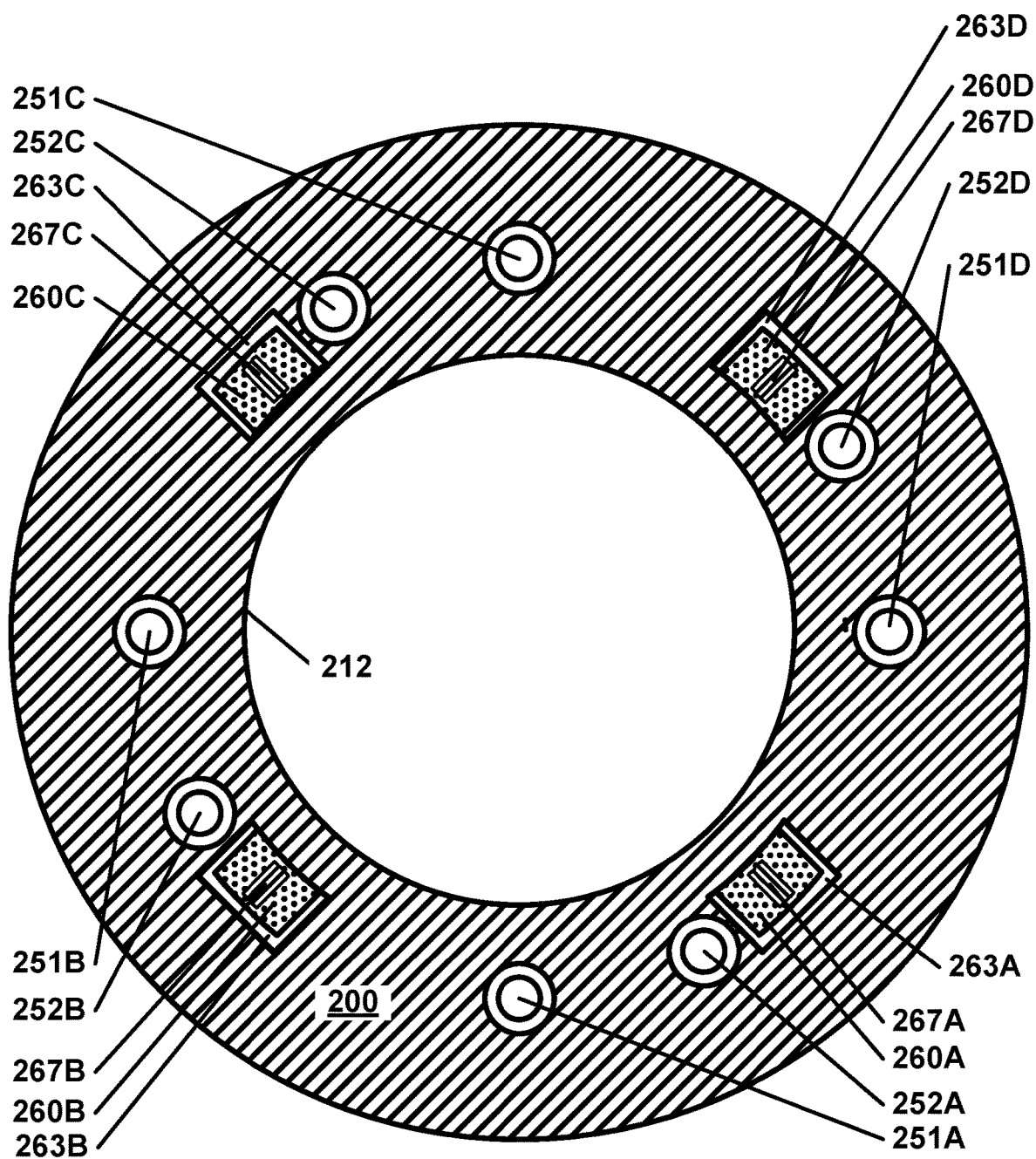
FIG. 5 is a bottom view of a mounting plate according to an aspect of an embodiment of the disclosure.

FIG. 3 is a perspective view of an example mounting plate 200 according to an aspect of an embodiment of the disclosure. FIG. 4 is a top view of example mounting plate 200 according to an aspect of an embodiment of the disclosure. FIG. 5 is a bottom view of example mounting plate 200 according to an aspect of an embodiment of the disclosure. The terms top and bottom are being used in the relative sense and are not indicative of an absolute position. The second plate 200 may comprise a plurality of attachment mounting points (for example, 251A, 251B, 251C, 251D, 252A, 252B, 252C, and 252D) mechanically configured to receive a plurality of mounting fasteners. The mounting fasteners may be mechanically configured to secure the second plate 200 to an object.

A fastener may comprise a hardware device that mechanically joins or affixes two or more objects together. According to an embodiment, fastener(s) may be used to create non-permanent joint(s); that is, joint(s) that may be removed or dismantled without damaging the joining components. Examples of non-permanent fastener(s) comprise, but are not limited to: screws, nails, buttons, clips, magnets, suction cups, staples, bolts, straps, and/or the like. According to an embodiment, fastener(s) may create a permanent joint; that is, joint(s) that may be joined such that there is a likelihood of damage when removing or dismantling the joining components. Examples of permanent fastener(s) comprise but are not limited to: crimping sleeves and/or tabs, welding materials, solder, tape, glue, cement, other adhesives, and/or the like. Once the housing is coupled with the surface mount plate 200, the housing may be rotated to the desired rotational orientation. Such arrangements can help eliminate the need for adjusting the orientation of the surface mount plate 200.

According to an embodiment, a mounting plate 200 may comprise multiple mounting holes (for example, 251A, 251B, 251C, 251D, 252A, 252B, 252C, and 252D), which may be designed to receive fasteners. The mounting plate 200 may be, for example, a surface mounting plate. A mounting plate 200 may be first structure that mounts hardware to a second structure such as, for example, a wall, a ceiling, a cabinet, a floor, a pole, a mobile device, and/or the like. The mounting plate 200 may comprise a shape that is complementary to the second structure. Such holes may allow for fastener(s) to be used to mount the mounting plate to a second structure, such as a surface. An orientation of the mounting plate 200 with relation to the surface may not be critical since the housing 300 to be attached with the surface mount plate 200 may be rotated after being coupled with the mounting plate.

According to an embodiment, the second plate 200 may be mechanically configured to cover an electrical box opening. According to an embodiment, at least two of the attachment mounting points (for example, 251A, 251B, 251C, 251D, 252A, 252B, 252C, and 252D) may be positioned to align with electrical box mounting points. According to an embodiment, at least two of the attachment mounting points (for example, 251A, 251B, 251C, 251D, 252A, 252B, 252C, and 252D) may comprise at least one mounting hole pair.

According to an embodiment, the object may be an electrical box. According to an embodiment, the object may be one of: a wall, a ceiling, and a floor. According to an embodiment, the object may be a surface. According to an embodiment, the object may be a lighting fixture.

A second lip 212 may extend around at least a part of a second portion of the second plate 200. According to an embodiment, the second lip 212 may be substantially circular. According to an embodiment, the second lip 212 may run along an outer perimeter of the second plate 200. According to an embodiment, the second lip 212 may run along an inner perimeter of the second plate 200. According to an embodiment, the second lip 212 may run around a first distance from a point located in a center portion of the second plate 200. According to an embodiment, the second lip 212 may rise from the plane of the second plate 200. According to an embodiment, at least a portion of the second lip 212 may be mechanically configured to fit inside at least a portion of the first lip 111. According to an embodiment, at least a portion of the second lip 212 may be mechanically configured to rotate inside at least a portion of the first lip 111.

According to an embodiment, the second portion may comprise an outer section of the second plate 200. According to an embodiment, the second portion may comprise an inner section of the second plate 200. According to an embodiment, the second portion may comprise a void in the second plate 200. According to an embodiment, the void 242 may be a wiring via. According to an embodiment, the second portion may comprise an elevated portion of the second plate 200. According to an embodiment, the second portion may comprise a sunken portion of the second plate 200.

A plurality of mounting tabs (for example, 260A, 260B, 260C, and 260D) may be distributed along the second lip 212. The plurality of mounting tabs (for example, 260A, 260B, 260C, and 260D) may be positioned to align with at least two of the plurality of lip gaps (for example, 120A, 120B, 120C, and 120D). According to an embodiment, tab opening(s) (for example, 263A, 263B, 263C, and 263D) may be formed below tab(s) (for example, 260A, 260B, 260C, and 260D). According to an embodiment, an area of the tab(s) (for example, 260A, 260B, 260C, and 260D), may be at least partially solid. Referring to FIG. 5, second indexing formations (for example, 267A, 267B, 267C, and 232D) disposed on tab(s) (for example, 260A, 260B, 260C, and 260D) are illustrated through tab opening(s) (for example, 263A, 263B, 263C, and 263D).

Figure 6:
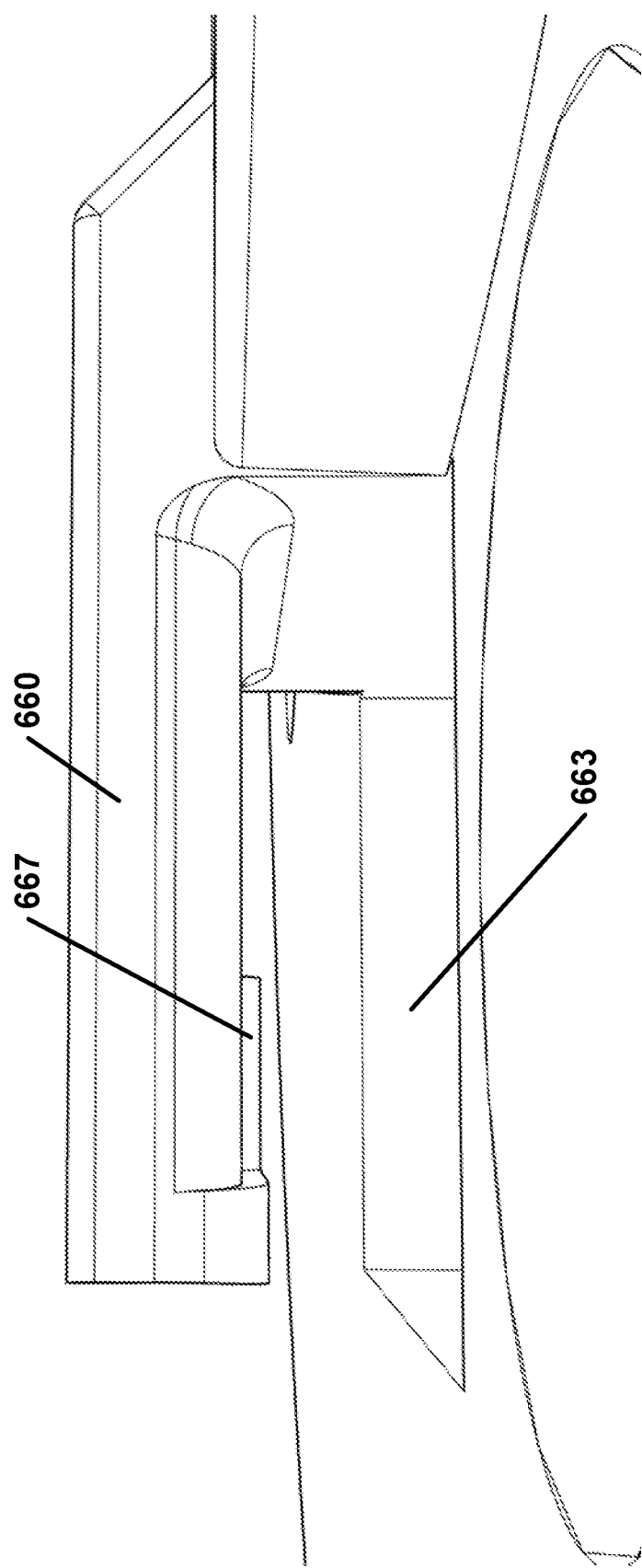
FIG. 6 illustrates a partial perspective view of a mounting plate with a tab, indexing formation and a tab opening according to an aspect of an embodiment of the disclosure.
Figure 7:
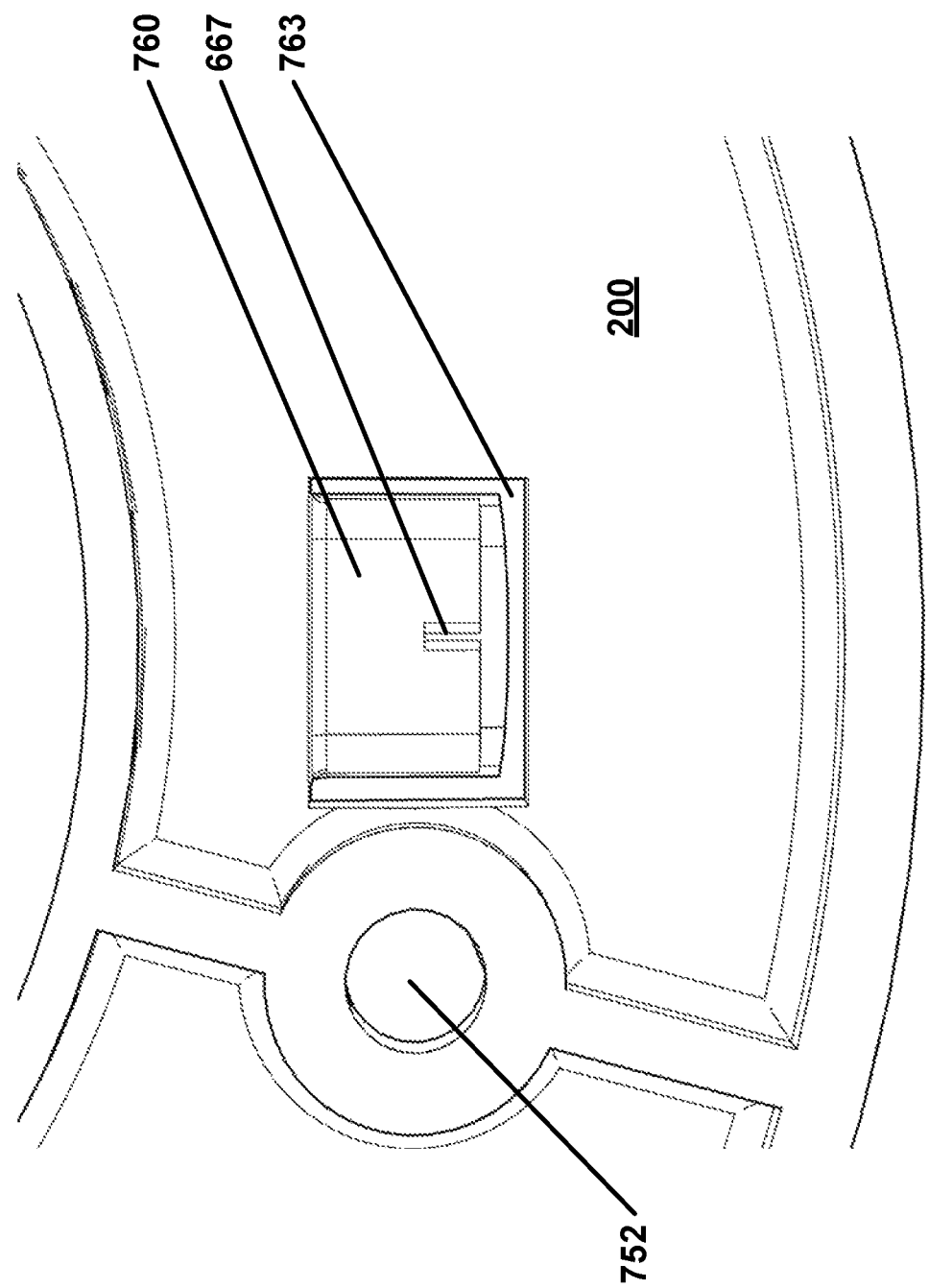
FIG. 7 illustrates a partial bottom view of a mounting plate with a tab, indexing formation and a tab opening according to an aspect of an embodiment of the disclosure.

FIG. 6 illustrates a partial perspective view of an example mounting plate 200 with an example tab 660, and an example indexing formation 667. According to an embodiment, there may be a tab opening 663 below the tab. FIG. 7 illustrates a partial view of an example mounting plate 200 looking through example tab opening 763 showing example tab 760, and example indexing formation 767. Also shown is an example attachment mounting point 752 according to an aspect of an embodiment of the disclosure.

According to an embodiment, at least one of the plurality of mounting tabs (for example, 260A, 260B, 260C, and/or 260D) may comprise a cantilevered tab extending away from the second lip 212. According to an embodiment, at least one of the plurality of mounting tabs (for example, 260A, 260B, 260C, and/or 260D) may comprise a formed portion of the second lip 212.

Figure 8A:
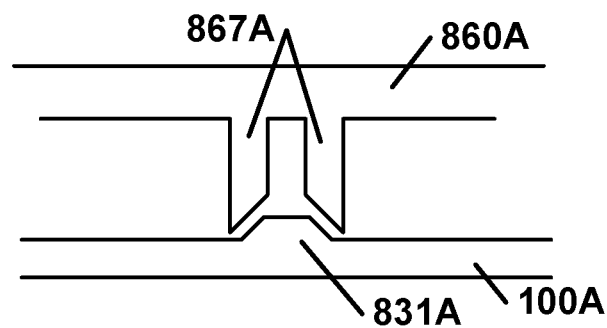
FIG. 8A illustrates example indexing formations according to an aspect of an embodiment of the disclosure.
Figure 8B:
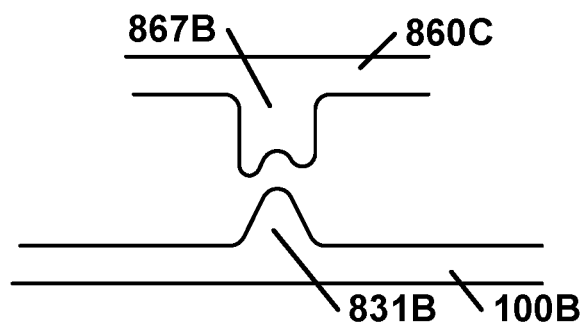
FIG. 8B illustrates example indexing formations according to an aspect of an embodiment of the disclosure.
Figure 8C:
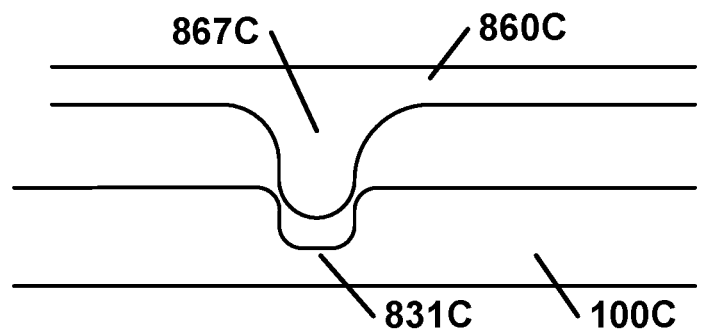
FIG. 8C illustrates example indexing formations according to an aspect of an embodiment of the disclosure.

FIG. 8A, FIG. 8B, and FIG. 8C illustrate example pairs of first indexing formations (for example, 831A, 831B, and 831C) disposed on a tab (for example, 860A, 860B, and/or 860C), and second indexing formations (for example, 832A, 832B, and/or 832C) disposed on plate (for example, 100A, 100B, and/or 100C). A characteristic of the indexing formations is that they may comprise a force sufficient to: (1) allow a first plate (for example, 100, 100A, 100b, and/or 100C) to be rotated between first index formations (for example, 831A, 831B, and/or 831C) relative to second index formations (for example, 867A, 867B, and/or 867C) disposed on tabs tab (for example, 860A, 860B, and/or 860C) of a second plate (for example, 200, 200A, 200b, and/or 200C), and (2) prevent the first plate from rotating relative to the second plate after the first plate and second plate are rotated to a desired location.

According to an embodiment, at least one of the plurality of second indexing formations (for example, 267A, 267B, 267C, and/or 267D) may extend away from one of the plurality of mounting tabs (for example, 260A, 260B, 260C, and/or 267D). According to an embodiment, at least one of: the plurality of first indexing formations (for example, 131A, 131B, 131C, and/or 131D) and second indexing formations (for example, 267A, 267B, 267C, and/or 267D) disposed on tabs (for example, 267A, 260B, 260C, and 260D) may comprise a resilient member. According to an embodiment, at least one of: the plurality of first indexing formations (for example, 131A, 131B, 131C, and 131D) and second indexing formations (for example, 267A, 267B, 267C, and/or 267D) disposed on tabs (for example, 260A, 260B, 260C, and 260D) may comprise a spring bias. According to an embodiment, at least one of: the plurality of first indexing formations (for example, 131A, 131B, 131C, and 131D) and second indexing formations (for example, 267A, 267B, 267C, and/or 267D) disposed on tabs (for example, 260A, 260B, 260C, and 260D) may comprise a restorative spring force sufficient to prevent the first plate 100 from rotating relative to the second plate 200.

Figure 9:
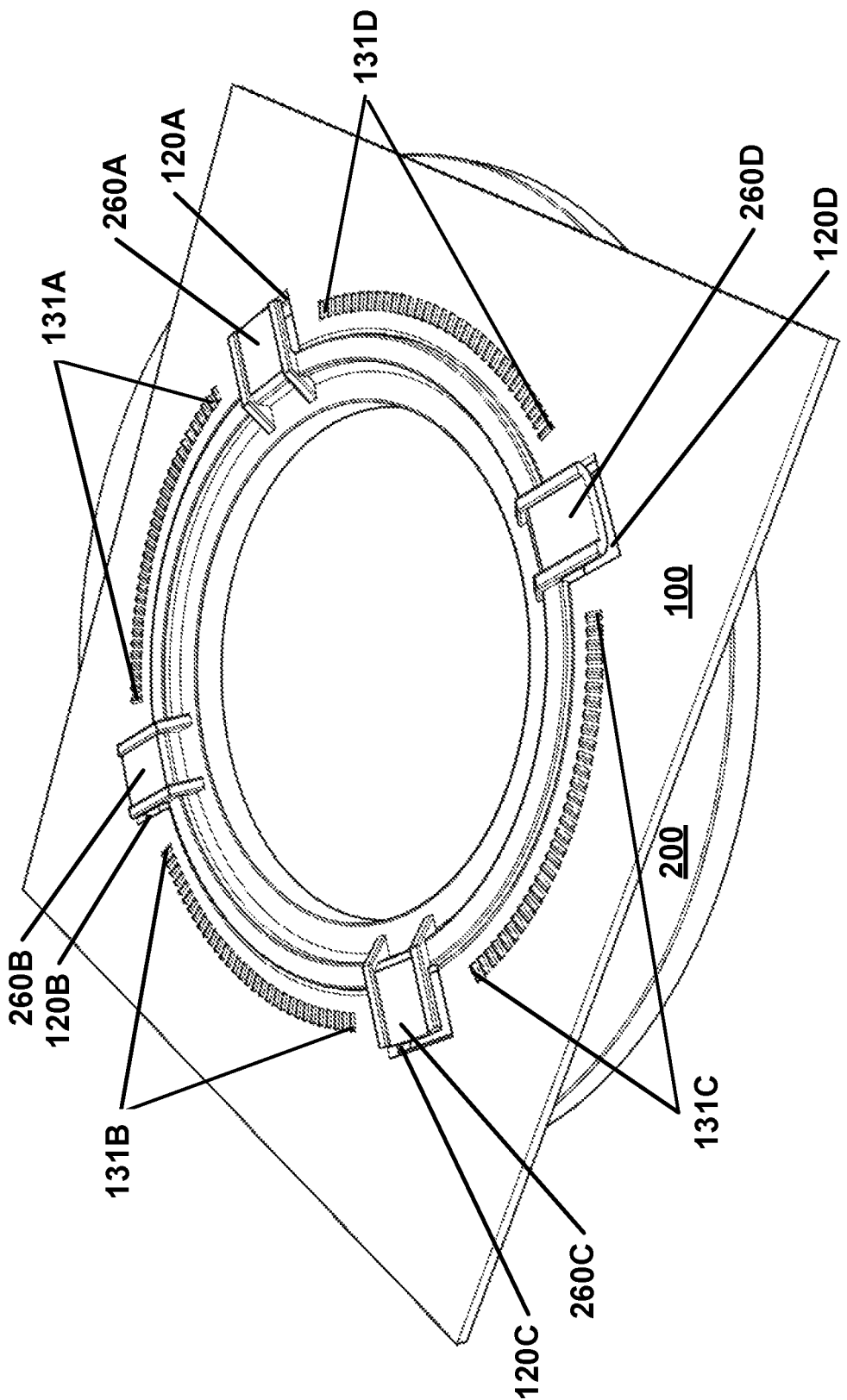
FIG. 9 is a perspective view of a mounting plate being fitted to a housing plate according to an aspect of an embodiment of the disclosure.
Figure 10:
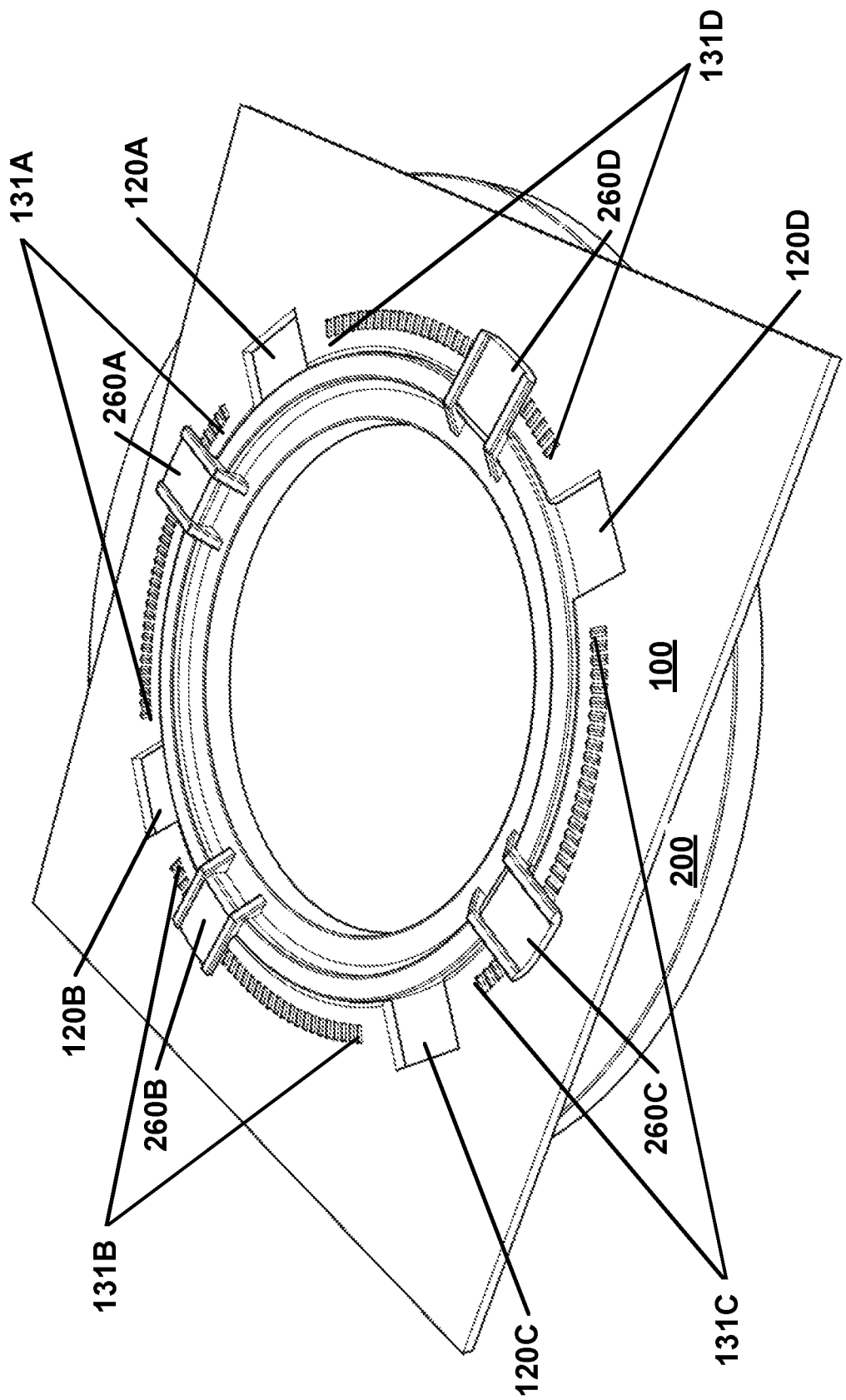
FIG. 10 is a perspective view of a mounting plate fitted to a housing plate according to an aspect of an embodiment of the disclosure.

A plurality of second indexing formations (for example, 267A, 267B, 267C, and/or 267D) may be disposed on the plurality of mounting tabs (for example, 260A, 260B, 260C, and/or 260D). The plurality of second indexing formations (for example, 267A, 267B, 267C, and/or 267D) may be mechanically configured to engage at least one of the plurality of first indexing formations (for example, 131A, 131B, 131C, and/or 131D) in response to a process, such as for example, illustrated in FIG. 9 and/or FIG. 10. FIG. 9 is a perspective view of a mounting plate 200 being fitted to a housing plate 100 according to an aspect of an embodiment of the disclosure. In this configuration, at least two of the plurality of mounting tabs (for example, 260A, 260B, 260C, and/or 260D) may be inserted through at least two of the plurality of lip gaps (for example, 120A, 120B, 120C, and/or 120D). FIG. 9 is a perspective view of a mounting plate 200 fitted to a housing plate 100 according to an aspect of an embodiment of the disclosure. In this configuration, the second plate 200 may be rotated with respect to the first plate 100 until at least one of the plurality of first indexing formations (for example, 131A, 131B, 131C, and/or 131D) is aligned with at least one of the plurality of second indexing formations (for example, 267A, 267B, 267C, and/or 267D) disposed on the disposed on the plurality of mounting tabs (for example, 230A, 230B, 230C, and/or 230D).

According to an embodiment, at least one of the plurality of first indexing formations (for example, 131A, 131B, 131C, and/or 131D) and at least one of the plurality of second indexing formations (for example, 267A, 267B, 267C, and/or 267D) may be mechanically configured to provide a tactile feedback in response to the rotation of the first plate 100 with respect to the second plate 200.

According to an embodiment: the first plate 100 may comprise a first wiring via 141, and the second plate 200 may comprise a second wiring via 142. According to an embodiment: the first plate 100 may comprise a first via 141, and the second plate 200 may comprise a second via 142.

According to various embodiments, the plurality of first indexing formations (for example, 131A, 131B, 131C, and/or 131D) and the plurality of second indexing formations (for example, 267A, 267B, 267C, and/or 267D) may be distributed to enable the first plate 100 to be rotated different amounts in relation to the second plate 200. The amount of rotation may be configured based on, for example, sensors, physical locality, and/or the like. For example, according to an embodiment, the plurality of first indexing formations (for example, 131A, 131B, 131C, and/or 131D) and the plurality of second indexing formations (for example, 267A, 267B, 267C, and/or 267D) may be distributed to enable the first plate 100 to be rotated at least 40 degrees in relation to the second plate 200. According to an embodiment, the plurality of first indexing formations (for example, 131A, 131B, 131C, and/or 131D) and the plurality of second indexing formations (for example, 267A, 267B, 267C, and/or 267D) may be distributed to enable the first plate 100 to be rotated at least 10 degrees in relation to the second plate 200. According to an embodiment, the plurality of first indexing formations (for example, 131A, 131B, 131C, and/or 131D) and the plurality of second indexing formations (for example, 267A, 267B, 267C, and/or 267D) may be distributed to enable the first plate 100 to be rotated greater than 90 degrees in relation to the second plate 200.

According to an embodiment, the mounting system may further comprise a sensor housing disposed to the second plate 200.

Figure 11:
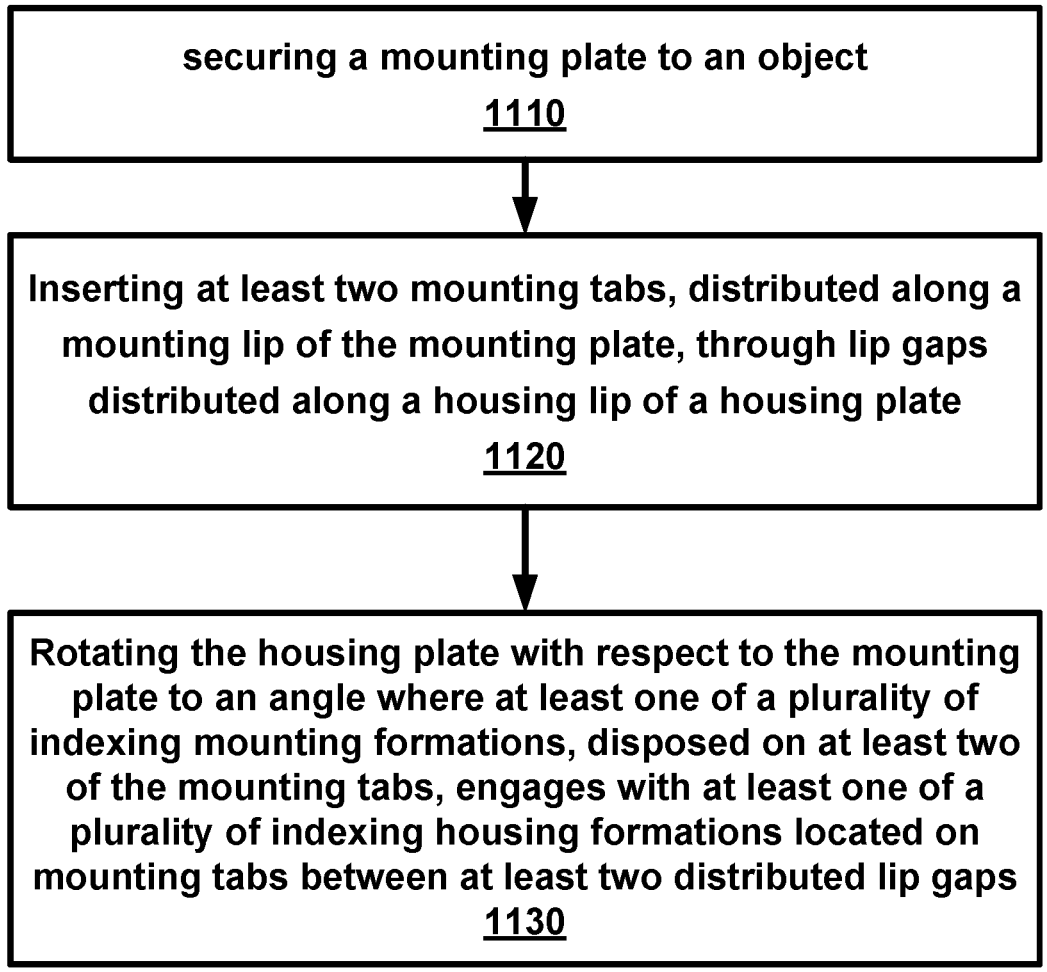
FIG. 11 is a flow diagram of a process of using an adjustable sensor mounting system as per an aspect of an embodiment of the present invention.

FIG. 11 is a flow diagram of a process of using an adjustable sensor mounting system as per an aspect of an embodiment of the present invention. At 1010, a mounting plate (for example, mounting plate 200) may be secured to an object (and/or structure) employing a plurality of mounting fasteners attached to the object through a plurality of attachment mounting points (for example, 251A, 251B, 251C, 251D, 252A, 252B, 252C, and 252D) of the mounting plate. The mounting plate may comprise: a plurality of mounting tabs (for example, 230A, 230B, 230C, and 230D) distributed along a circular mounting lip; and a plurality of mounting indexing formations disposed on at least two of the plurality of mounting tabs (for example, 230A, 230B, 230C, and 230D).

At 1020, at least two of the plurality of mounting tabs (for example, 230A, 230B, 230C, and 230D) may be inserted through at least two of a plurality of lip gaps (for example, 120A, 120B, 120C, and 120D) distributed along a circular housing lip of a housing plate.

At 1030, the housing plate may be rotated with respect to the mounting plate to an angle where at least one of a plurality of indexing mounting formations engages with at least one of a plurality of indexing housing formations, where: the plurality of indexing mounting formations may be located on the plurality of mounting tabs (for example, 230A, 230B, 230C, and 230D); and the plurality of indexing housing formations are located between at least two of the plurality of distributed lip gaps.

According to an embodiment, the process may further comprise mounting the housing plate. According to an embodiment, the process may further comprise determining the angle based, at least in part, on sensor characteristics of a sensor device attached to the housing plate.

According to an alternative embodiment, at 1010, a mounting plate may be secured to an object employing a plurality of mounting fasteners attached to the object through a plurality of attachment mounting points (for example, 251A, 251B, 251C, 251D, 252A, 252B, 252C, and 252D) of the mounting plate. At 1020, at least two of a plurality of mounting tabs (for example, 230A, 230B, 230C, and 230D), distributed along a circular mounting lip of the mounting plate, may be inserted through at least two of a plurality of lip gaps (for example, 120A, 120B, 120C, and 120D) distributed along a circular housing lip of a housing plate. At 1030, the housing plate may be rotated with respect to the mounting plate to an angle where at least one of a plurality of indexing mounting formations, disposed on at least two of the plurality of mounting tabs (for example, 230A, 230B, 230C, and 230D), engages with at least one of a plurality of indexing housing formations located on the plurality of mounting tabs (for example, 230A, 230B, 230C, and 230D) between at least two of the plurality of distributed lip gaps.

According to an embodiment, a device may comprise: a housing, at least one sensor, and at least a first plate. The housing may be a rotatable housing. The at least one sensor may be disposed in the housing. The first plate of the housing may comprise a first circular lip, a plurality of distributed lip gaps, and a plurality of first indexing formations. The first circular lip may extend around at least a part of a first portion of the first plate. The plurality of distributed lip gaps may be distributed along the first circular lip. The plurality of first indexing formations may be distributed along the first circular lip between at least two of the plurality of distributed lip gaps, and a plurality of second indexing formations. The first plate may be mechanically configured to mate with a second plate. The second plate may comprise a plurality of attachment mounting points, a second circular lip, a plurality of distributed indexing tabs, and a plurality of second indexing formations. The plurality of attachment mounting points may be configured to receive a plurality of mounting fasteners. The mounting fasteners may be mechanically configured to secure the second plate to an object. The second circular lip may extend around at least a part of a second portion of the second plate. A plurality of distributed indexing tabs may be positioned and mechanically configured along the second circular lip in relative alignment with at least two of the plurality of distributed lip gaps. A plurality of second indexing formations may be: disposed on the plurality of distributed mounting tabs; complementary in shape to the first indexing formations; and mechanically configured to engage at least one of the plurality of first indexing formations in response to the second plate: having at least two of the plurality of distributed mounting tabs inserted through at least two of the plurality of distributed lip gaps; and rotated with respect to the first plate until at least one of the plurality of first indexing formations is aligned with at least one of the plurality of second indexing formations.

According to an embodiment, a mounting system may comprise: a first plate and a second plate. The first plate may comprise: a first circular lip, a plurality of lip gaps, and a plurality of first indexing formations. The first circular lip may extend around at least a part of a first portion of the first plate. The plurality of lip gaps may be distributed along the first circular lip. The plurality of first indexing formations may be distributed along the first circular lip between at least two of the plurality of distributed lip gaps and a second plate. The second plate may comprise: a plurality of attachment mounting points, a second circular lip, a plurality of mounting tabs, and a plurality of second indexing formations. The plurality of attachment mounting points may be mechanically configured to receive a plurality of mounting fasteners. The mounting fasteners may be mechanically configured to secure the second plate to an object. The second circular lip may extend around at least a part of a second portion of the second plate. The plurality of mounting tabs may be distributed along the second circular lip, and positioned to align with at least two of the plurality of lip gaps. The plurality of second indexing formations may be disposed on the plurality of mounting tabs and mechanically configured to engage at least one of the plurality of first indexing formations in response to the second plate: having at least two of the plurality of mounting tabs inserted through at least two of the plurality of lip gaps, and rotated with respect to the first plate until at least one of the plurality of first indexing formations is aligned with at least one of the plurality of second indexing tabs.

According to an embodiment, a mounting plate may provide a secure mount that enables a rotatable plate to be rotated. The rotatable plate may comprise a plate, a housing plate, a housing surface, a housing, a mount, combinations thereof, and/or the like. The mounting plate may comprise a plurality of mounting tabs. The mounting plate may comprise an indexing tab on the underside of mounting tabs. The mounting plate may comprise pairs of mounting holes to attach a ring portion of another object. The distance between the holes in a pair (hole circle diameter) may align with mounting holes of an electrical box. The rotatable plate may comprise slots that let the mounting tabs pass through and one or more arrays of indexing tabs that are of the same scale as the indexing tab on the mounting plate. The rotatable plate may engage with the mounting plate by pushing it down on the mounting plate and passing the mounting tabs though the mounting slots. The rotatable plate may be rotated to engage the indexing tab on the mounting plate with the array of indexing tabs on the rotatable plate. The mounting plate may comprise offset pairs of mounting holes. The angular offset of the pairs may be set so that there will be a way to firmly attach the mounting plate that enables the rotatable plate to be engaged with the mounting plate at any desired rotation angle. The indexing tabs may engage with the indexing arrays to provide a positive hold at various integer number of tab positions in the arrays.

In this specification, "a" and "an" and similar phrases are to be interpreted as "at least one" and "one or more." In this specification, the term "may" is to be interpreted as "may, for example." In other words, the term "may" is indicative that the phrase following the term "may" is an example of one of a multitude of suitable possibilities that may, or may not, be employed to one or more of the various embodiments. The phrase "based on" is indicative that the phrase following the term "based on" is an example of one of a multitude of suitable possibilities that may, or may not, be employed to one or more of the various embodiments. The phrase "in response to" is indicative that the phrase following the phrase "in response to" is an example of one of a multitude of suitable possibilities that may, or may not, be employed to one or more of the various embodiments. The terms "including" and "comprising" should be interpreted as meaning "including, but not limited to".

In this disclosure, various embodiments are disclosed. Limitations, features, and/or elements from the disclosed example embodiments may be combined to create further embodiments within the scope of the disclosure.

The disclosure of this patent document incorporates material which is subject to copyright protection. The copyright owner has no objection to the facsimile reproduction by anyone of the patent document or the patent disclosure, as it appears in the Patent and Trademark Office patent file or records, for the limited purposes required by law, but otherwise reserves all copyright rights whatsoever.

The Figures described above, which highlight the functionality and characteristics of the present invention, are presented for example purposes only. The architecture of the present invention is sufficiently flexible and configurable, such that it may be utilized in ways other than that shown in the Figures. For example, the actions listed in any flowchart may be re-ordered or only optionally used in some embodiments.

Finally, it is the applicant's intent that only claims that include the express language "means for" or "step for" be interpreted under 35 U.S.C. 112. Claims that do not expressly include the phrase "means for" or "step for" are not to be interpreted under 35 U.S.C. 112.

The foregoing descriptions of the present embodiments of the present invention have been presented for purposes of illustration and description. They are not intended to be exhaustive or to limit the invention to the precise forms disclosed, and obviously many modifications and variations are possible in light of the above teaching. The illustrated embodiments were chosen and described in order to best explain the principles of the invention and its practical application to thereby enable others skilled in the art to best utilize the invention in various embodiments and with various modifications as are suited to the particular use contemplated. For example, one skilled in the art will recognize that the present invention may be employed to align parts within a machine tool. Similarly, one skilled in the art will recognize that the present invention may be employed to align the angle of a store display or sign.

While various embodiments of the present invention have been described above, it should be understood that they have been presented by way of example, and not limitation. It will be apparent to persons skilled in the relevant art(s) that various changes in form and detail can be made therein without departing from the spirit and scope of the present invention. Thus, the present invention should not be limited by any of the above-described exemplary embodiments.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

What is claimed is:

1. A sensor mounting system comprising:
a sensor housing;
at least one sensor:
  comprising a directional sensing preference; and
  disposed in the sensor housing;
a first plate of the sensor housing, comprising:
  a first circular lip extending around at least a part of a first portion of the first plate;
  a plurality of distributed lip gaps distributed along the first circular lip;
  a plurality of first indexing formations distributed along the first circular lip between at least two of the plurality of distributed lip gaps; and
  a first wiring via positioned on the concave side of the first circular lip; and
a second plate comprising:
  a plurality of attachment mounting points configured to receive a plurality of mounting fasteners, the mounting fasteners mechanically configured to secure the second plate to an electrical box;
  a second circular lip extending around at least a part of a second portion of the second plate;
  a second wiring via positioned on the concave side of the second circular lip;
  a plurality of distributed indexing tabs positioned and configured along the second circular lip in relative alignment to at least two of the plurality of distributed lip gaps; and
  a plurality of second indexing formations:
    disposed on the plurality of distributed mounting tabs; and
    configured to engage at least one of the plurality of first indexing formations in response to the second plate:
      having at least two of the plurality of distributed mounting tabs inserted through at least two of the plurality of distributed lip gaps; and
      rotated with respect to the first plate until:
        at least one of the plurality of first indexing formations is aligned with at least one of the plurality of second indexing formations; and
        there is sufficient force applied between at least one of the plurality of first indexing formations and at least one of the plurality of second indexing formations to hold the first plate in relative position with the second plate.

2. A mounting system comprising:
a first plate, comprising:
  a first circular lip extending around at least a part of a first portion of the first plate;
  a plurality of lip gaps distributed along the first circular lip; and
  a plurality of first indexing formations distributed along the first circular lip between at least two of the plurality of distributed lip gaps; and
a second plate, comprising:
  a plurality of attachment mounting points mechanically configured to receive a plurality of mounting fasteners, wherein the mounting fasteners are structurally configured to secure the second plate to an object;
  a second circular lip extending around at least a part of a second portion of the second plate;
  a plurality of mounting tabs:
    distributed along the second circular lip; and positioned to align with at least two of the plurality of lip gaps; and a plurality of second indexing formations:
- disposed on the plurality of mounting tabs; and
- structurally configured to engage at least one of the plurality of first indexing formations in response to the second plate:
  - having at least two of the plurality of mounting tabs inserted through at least two of the plurality of lip gaps; and
  - rotated with respect to the first plate until at least one of the plurality of first indexing formations is aligned with at least one of the plurality of second indexing tabs.

3. The mounting system of claim 1, wherein first plate is integrated with a sensor housing.

4. The mounting system of claim 1, wherein the first circular lip runs along an inner perimeter of the first plate.

5. The mounting system of claim 1, wherein at least a portion of the first circular lip is sized to rotatably surround at least a portion of the first circular lip.

6. The mounting system of claim 1, wherein the first portion comprises an inner section void of the first plate.

7. The mounting system of claim 1, wherein at least two of the plurality of lip gaps are in relative alignment with at least two of the plurality of mounting tabs.

8. The mounting system of claim 1, wherein at least one of the plurality of first indexing formations comprise a gap.

9. The mounting system of claim 1, wherein at least one of the plurality of first indexing formations comprises a bulge.

10. The mounting system of claim 1, wherein at least one of the plurality of first indexing formations is complementary shaped to at least one of the plurality of second indexing formations.

11. The mounting system of claim 1, wherein the object is a lighting fixture.

12. The mounting system of claim 1, wherein the second circular lip runs along an inner perimeter of the second plate.

13. The mounting system of claim 1, wherein at least one of the plurality of mounting tabs comprises a cantilevered tab extending away from the second circular lip.

14. The mounting system of claim 1, wherein at least one of the plurality of mounting tabs comprises a formed portion of the second circular lip.

15. The mounting system of claim 1, wherein at least one of the plurality of second indexing formations extends away from one of the plurality of mounting tabs.

16. The mounting system of claim 1, wherein at least one of: the plurality of first indexing formations and second indexing formations comprise a resilient member.

17. The mounting system of claim 1, wherein at least one of: the plurality of first indexing formations and second indexing formations comprise a spring bias.

18. The mounting system of claim 1, wherein at least one of: the plurality of first indexing formations and second indexing formations comprise a restorative spring force sufficient to prevent the first plate from rotating relative to the second plate.

19. The mounting system of claim 1, wherein at least one of the plurality of first indexing formations and at least one of the plurality of second indexing formations are mechanically configured to provide a tactile feedback in response to the rotation of the first plate with respect to the second plate.

20. The mounting system of claim 1, wherein:
the first plate comprises a first wiring via; and
the second plate comprises a second wiring via.

* * * * *